(12) United States Patent
Ando et al.

(10) Patent No.: US 9,564,500 B2
(45) Date of Patent: Feb. 7, 2017

(54) FULLY-DEPLETED SOI MOSFET WITH U-SHAPED CHANNEL

(71) Applicant: International Business Machines Corporation, Armonk, NY (US)

(72) Inventors: Takashi Ando, Tuckahoe, NY (US); Robert H. Dennard, Croton-on-Hudson, NY (US); Isaac Lauer, Yorktown Heights, NY (US); Ramachandran Muralidhar, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/788,253

(22) Filed: Jun. 30, 2015

(65) Prior Publication Data

US 2017/0005173 A1 Jan. 5, 2017

(51) Int. Cl.
*H01L 21/00* (2006.01)
*H01L 29/423* (2006.01)
(Continued)

(52) U.S. Cl.
CPC ..... *H01L 29/42356* (2013.01); *H01L 29/0649* (2013.01); *H01L 29/401* (2013.01);
(Continued)

(58) Field of Classification Search
CPC .......... H01L 29/42536; H01L 29/0649; H01L 29/401; H01L 29/41758; H01L 29/6656
(Continued)

(56) References Cited

U.S. PATENT DOCUMENTS 6,429,055 B2   8/2002   Oh
6,509,609 B1   1/2003   Zhang et al.
(Continued)

FOREIGN PATENT DOCUMENTS

CN   102208416 A   10/2011
CN   102208416 B   6/2013
(Continued)

OTHER PUBLICATIONS

List of IBM Patents or Applications Treated as Related.
(Continued)

*Primary Examiner* — Long K Tran
(74) *Attorney, Agent, or Firm* — Louis J. Percello; Michael J. Chang, LLC

(57) ABSTRACT

A method of forming a MOSFET device is provided including: providing an SOI wafer; forming a dummy gate oxide and dummy gates on portions of the SOI layer that serve as channel regions of the device; forming spacers and doped source/drain regions in the SOI layer on opposite sides of the dummy gates; depositing a gap fill dielectric; removing the dummy gates/gate oxide; recessing areas of the SOI layer exposed by removal of the dummy gates forming one or more u-shaped grooves that extend part-way through the SOI layer such that a thickness of the SOI layer remaining in the channel regions is less than a thickness of the SOI layer in the doped source/drain regions under the spacers; and forming u-shaped replacement gate stacks in the u-shaped grooves such that u-shaped channels are formed in fully depleted regions of the SOI layer adjacent to the u-shaped replacement gate stacks.

13 Claims, 5 Drawing Sheets

(51) Int. Cl.
*H01L 29/66* (2006.01)
*H01L 29/06* (2006.01)
*H01L 29/40* (2006.01)
*H01L 29/417* (2006.01)

(52) U.S. Cl.
CPC .. *H01L 29/41758* (2013.01); *H01L 29/66545* (2013.01); *H01L 29/66553* (2013.01); *H01L 29/66621* (2013.01)

(58) Field of Classification Search
USPC .................................................. 438/149, 151
See application file for complete search history.

(56) References Cited

U.S. PATENT DOCUMENTS

| | | | |
|---|---|---|---|
| 6,841,831 B2 | 1/2005 | Hanafi et al. | |
| 7,772,633 B2 | 8/2010 | Juengling | |
| 8,889,540 B2 | 11/2014 | Basker et al. | |
| 2014/0042543 A1* | 2/2014 | Cheng | H01L 29/66772 257/347 |
| 2014/0061723 A1 | 3/2014 | Quenette | |
| 2014/0061799 A1* | 3/2014 | Fan | H01L 29/42384 257/347 |
| 2014/0117470 A1* | 5/2014 | Baskaran | B81B 7/0006 257/415 |
| 2014/0239398 A1 | 8/2014 | Cheng et al. | |

FOREIGN PATENT DOCUMENTS

| | | |
|---|---|---|
| JP | 3222380 B2 | 10/2001 |
| KR | 20020003028 A | 1/2002 |

OTHER PUBLICATIONS

English Translation of CN Application CN102208416A by Shing-Hwa Renn; Nanya Technology Corp. Oct. 5, 2011.
English Translation of CN Application CN102208416B by Shing-Hwa Renn; Nanya Technology Corp. Jun. 26, 2013.
English Translation of KR Application KR20020003028A by Oh Jeong Hui; Hynix Semiconductor Jan. 10, 2002.
English Translation of JP Application JP3222380B2 by Aruberuto Adan et al.; Sharp Corp. Oct. 29, 2001.

* cited by examiner

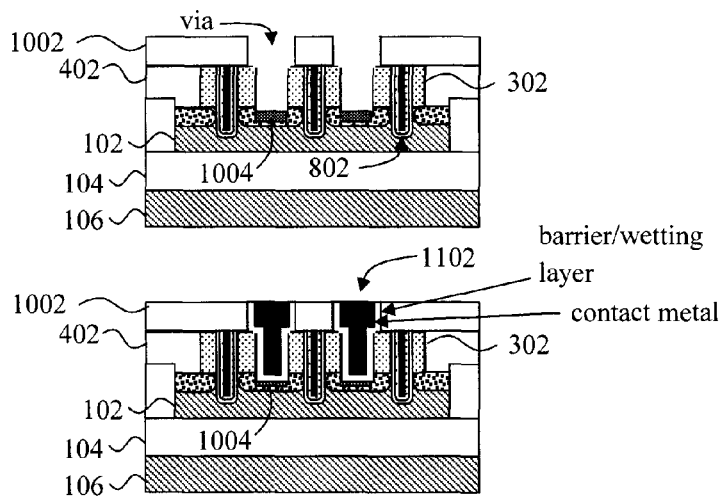
FIG. 10
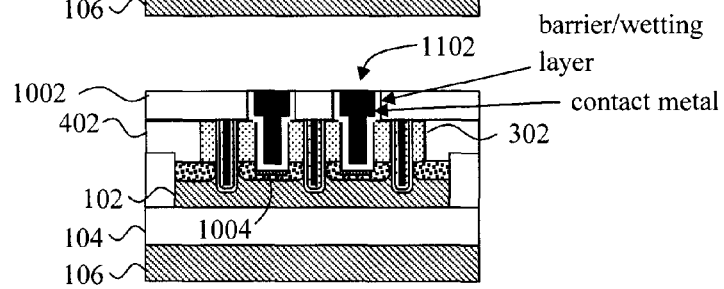
FIG. 11
FIG. 12
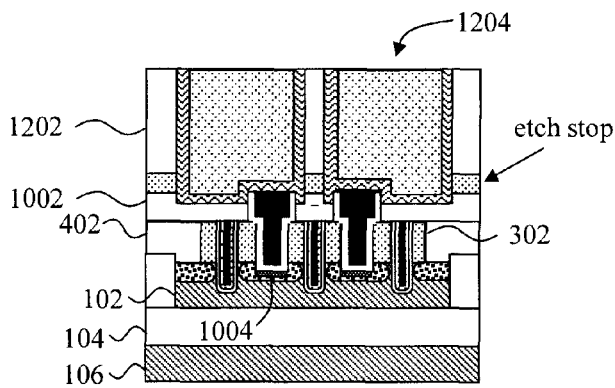
FIG. 13
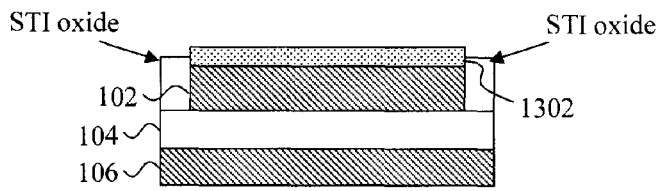
FIG. 14
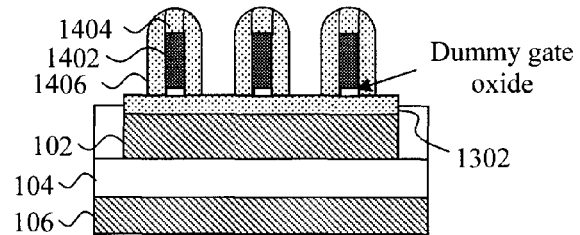

areas of source drain extension/SOI exposed by removal of the dummy gates recess etch to form u-shaped grooves in SOI thinned SOI Abrupt epitaxial source/drain junctions gate fill metal gate dielectric   workfunction metal

FULLY-DEPLETED SOI MOSFET WITH U-SHAPED CHANNEL

FIELD OF THE INVENTION

The present invention relates to metal-oxide semiconductor field-effect transistor (MOSFET) logic devices, and more particularly, to fully-depleted MOSFETs with u-shaped channels formed using a replacement gate process.

BACKGROUND OF THE INVENTION

Short channel effects in bulk metal-oxide semiconductor field-effect transistor (MOSFET) devices occur when the channel length is on the same order of magnitude as the combined depletion widths of the source and drain. Short channel effects can undesirably impact device characteristics, such as shifting the threshold voltage.

In the interest of MOSFET device scaling, smaller channel lengths are needed. With smaller channel lengths, short channel effects however become a greater concern.

Thus, techniques for MOSFET fabrication that permit device scaling while minimizing the impact of short channel effects would be desirable.

SUMMARY OF THE INVENTION

The present invention provides fully-depleted metal-oxide semiconductor field-effect transistor (MOSFET) logic devices with u-shaped channels and techniques for formation thereof using a replacement gate process. In one aspect of the invention, a method of forming a MOSFET device is provided. The method includes the steps of: providing a semiconductor-on-insulator (SOI) wafer having an SOI layer separated from a substrate by a buried oxide (BOX); forming a dummy gate oxide and one or more dummy gates on portions of the SOI layer that serve as channel regions of the MOSFET device, wherein the dummy gates oxide separates the dummy gates from the SOI layer; forming spacers on opposite sides of the dummy gates; forming doped source and drain regions in the SOI layer on opposite sides of the dummy gates; depositing a gap fill dielectric on the wafer, filling any gaps between the spacers; removing the dummy gates and the dummy gate oxide; recessing areas of the SOI layer exposed by removal of the dummy gates and the dummy gate oxide to form one or more u-shaped grooves that extend part way through the SOI layer such that a thickness of the SOI layer remaining in the channel regions is less than a thickness of the the SOI layer in the doped source and drain regions under the spacers; and forming u-shaped replacement gate stacks in the u-shaped grooves such that u-shaped channels are formed in fully depleted regions of the SOI layer adjacent to the u-shaped replacement gate stacks.

In another aspect of the invention, another method of forming a MOSFET device is provided. The method includes the steps of: providing an SOI wafer having an SOI layer separated from a substrate by a BOX; forming a doped layer on a side of the SOI layer opposite the BOX; forming a dummy gate oxide and one or more dummy gates on the doped layer over portions of the SOI layer that serve as channel regions of the MOSFET device, wherein the dummy gate oxide separates the dummy gates from the doped layer; forming spacers on opposite sides of the dummy gates; depositing a gap fill dielectric on the wafer, filling any gaps between the spacers; removing the dummy gates and the dummy gate oxide; recessing areas of the doped layer and underlying areas of the SOI layer exposed by removal of the dummy gates and the dummy gate oxide to form one or more u-shaped grooves that extend through the doped layer and part way through the SOI layer such that portions of the doped layer, which serve as doped source and drain regions, will be present on opposite sides of the u-shaped grooves and such that a thickness of the SOI layer remaining in the channel regions is thinner than a combined thickness of the doping layer and the SOI layer in the doped source and drain regions under the spacers; and forming u-shaped replacement gate stacks in the u-shaped grooves such that u-shaped channels are formed in fully depleted regions of the SOI layer adjacent to the u-shaped replacement gate stacks.

In yet another aspect of the invention, a MOSFET device is provided. The MOSFET device includes: a portion of an SOI layer separated from a substrate by a BOX; u-shaped gate stacks extending part way through the SOI layer in channel regions of the MOSFET device such that u-shaped channels are formed in fully depleted regions of the SOI layer adjacent to the u-shaped gate stacks; and doped source and drain regions on opposite sides of the u-shaped gate stacks, wherein a thickness of the SOI layer in the channel regions is less than a thickness of the SOI layer adjacent to the u-shaped gate stacks.

A more complete understanding of the present invention, as well as further features and advantages of the present invention, will be obtained by reference to the following detailed description and drawings.

BRIEF DESCRIPTION OF THE DRAWINGS

FIG. 10 is a cross-sectional diagram illustrating an interlayer dielectric having been deposited onto the wafer, vias having been patterned in the interlayer dielectric and the gap fill dielectric, down to the doped source and drain regions, and a silicide having been formed at the bottom of each of the vias according to an embodiment of the present invention;

FIG. 11 is a cross-sectional diagram illustrating metal interconnects having been formed in the vias according to an embodiment of the present invention;

FIG. 12 is a cross-sectional diagram illustrating a planarizing dielectric having been formed on the wafer, metal line trenches having been patterned in the planarizing dielectric, and the metal line trenches having been filled with a metal(s) to form M1 metal lines according to an embodiment of the present invention;

FIG. 13 is a cross-sectional diagram which, following from FIG. 1, illustrates that according to an alternative embodiment a doped source/drain extension layer is formed on the SOI layer according to an embodiment of the present invention;

FIG. 14 is a cross-sectional diagram illustrating a dummy gate oxide and dummy gates having been formed on the doped source/drain extension layer in the active area over portions of the SOI layer that serve as channel regions of the device, and spacers having been formed on opposite sides of the dummy gates according to an embodiment of the present invention;

DETAILED DESCRIPTION OF PREFERRED EMBODIMENTS

Provided herein are fully-depleted metal-oxide semiconductor field-effect transistor (MOSFET) devices with u-shaped channels and techniques for the fabrication thereof that employ a replacement gate process. Advantageously, the implementation of a u-shaped channel in accordance with the present techniques serves to give a competitive channel length with a narrow gate opening where short channel effects are improved by the topology and wherein the gate screens the thin channel region under it from the source and drain regions. U-shaped channels may also be employed in non-planar devices. For instance, fin field-effect transistor (finFET) logic devices with u-shaped channels are described, for example, in U.S. patent Ser. No. 14/788,297, entitled "FinFET With U-Shaped Channel," the contents of which are incorporated by reference as if fully set forth herein.

Figure 1:
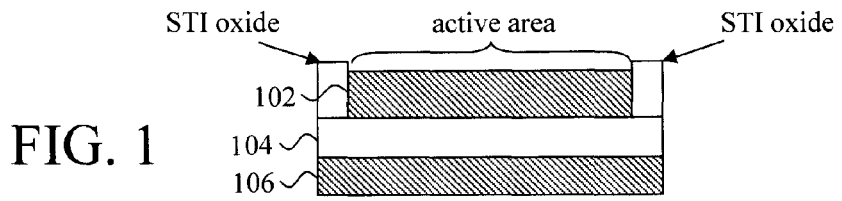
FIG. 1 is a cross-sectional diagram illustrating a semiconductor-on-insulator (SOI) wafer having a SOI layer separated from a substrate by a buried oxide (BOX) and wherein an active area(s) has been formed in the SOI layer using shallow trench isolation (STI) according to an embodiment of the present invention.
Figure 2:
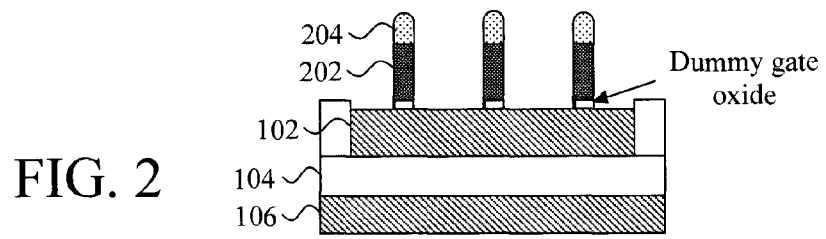
FIG. 2 is a cross-sectional diagram illustrating a dummy gate oxide and dummy gates having been formed on portions of the SOI layer in the active area that serve as channel regions of the device according to an embodiment of the present invention.

A first exemplary embodiment for fabricating a MOSFET device in accordance with the present techniques is now described by way of reference to FIGS. 1-12. The process begins as shown in FIG. 1 with a semiconductor-on-insulator (SOI) wafer which has an SOI layer 102 separated from a substrate 106 (e.g., a silicon (Si) substrate) by a buried oxide (or BOX) 104. The SOI layer 102 may be formed from any suitable semiconductor material, such as silicon (Si), germanium (Ge), or silicon germanium (SiGe). Preferably, an impurity doping concentration of the SOI layer 102 is very low, e.g., less than about $1\times10^{17}/cm^3$.

One or more active areas are then defined in the SOI layer 102. According to the exemplary embodiment illustrated in the figures, shallow trench isolation (or STI) is used to define the active areas. Namely, trenches are patterned in the SOI layer 102, and then filled with an insulator such as an oxide. The oxide in this case is referred to herein as an STI oxide. The present MOSFET devices will be formed in these isolated portions of the SOI layer.

By way of example only, the SOI layer 102 has a thickness of from about 8 nanometers (nm) to about 20 nm, and ranges therebetween. If commercially available SOI wafers are employed, the thickness of the SOI layer can be reduced, if needed, using a thermal oxidation and oxide strip process on the SOI layer which can be repeated until a desired thickness is achieved. As will be described in detail below, in order to form devices with well controlled short channel effects, select regions of the SOI layer will be recessed such that the SOI layer below the gate stack(s) and over the BOX will be thinner (e.g., less than about 10 nm—see below) than the SOI layer between the gate stack(s).

As highlighted above, a replacement gate process will be employed. A replacement gate process generally involves first forming a sacrificial or dummy gate(s) (often a polysilicon gate) which will serve as a placeholder for a final (or replacement) gate that will be formed later in the process. A replacement gate process will, in accordance with the present techniques, permit the replacement gate stacks to have a corresponding u-shaped configuration, thus creating the present u-shaped channel in the device.

To begin the replacement gate process, a dummy gate oxide and one or more dummy gates 202 are formed on portions of the SOI layer 102 in the active area that serve as channel regions of the MOSFET device. See FIG. 2. The dummy gates 202 are formed by first depositing/forming the dummy gate oxide on the SOI layer 102 in the active area. The dummy gate oxide will act as a stopping layer and protect the underlying SOI layer 102 during the dummy gate removal process described below. According to an exemplary embodiment, the dummy gate oxide is grown using thermal oxidation of the SOI layer 102 to a thickness of from about 2 nm to about 4 nm, and ranges therebetween. A thermal oxidation process will form a blanket layer of the dummy gate oxide on the SOI layer 102, which can be patterned along with the dummy gate poly-silicon (see below).

Next, a layer of poly-silicon (poly-Si) is blanket deposited onto the dummy gate oxide (i.e., onto a side of the dummy gate oxide opposite the SOI layer 102). A chemical vapor deposition (CVD) process, such as low pressure CVD (LP-CVD) may be used to deposit the poly-Si. By way of example only, the poly-Si may be deposited to a thickness of from about 100 nm to about 150 nm, and ranges therebetween. A dummy gate hardmask 204 is then patterned on the poly-Si with the footprint and location of the dummy gates 202. Suitable hardmask materials include, but are not limited to, nitride hardmask materials such as silicon nitride (SiN). An etching process, such as a poly-Si-selective reactive ion etching (RIE) is then used to pattern the poly-Si layer (via the dummy gate hardmasks) into the dummy gates 202. It is notable that patterning of the dummy gate oxide is not required. However, in practice the dummy gate oxide can be removed during the post dummy-gate-etch wet cleans (with, e.g., hydrofluoric acid (HF)).

Spacers 302 and doped source and drain regions are next formed on opposite sides of the dummy gates 202. See FIG. 3. By way of example only, the spacers 302 can be formed by blanket depositing a suitable spacer material (such as SiN) onto the wafer and then using an anisotropic etching process, such as RIE, to define spacers 302 in the material on opposite sides of the dummy gates. The spacers 302 will serve to offset the source and drain contact regions from the gates. Namely, each of the MOSFET devices being formed will include a source region and a drain region, a channel between the source and drain regions (the channel being formed in the channel region as described below), and a gate stack which regulates current flow through the channel.

Figure 3:
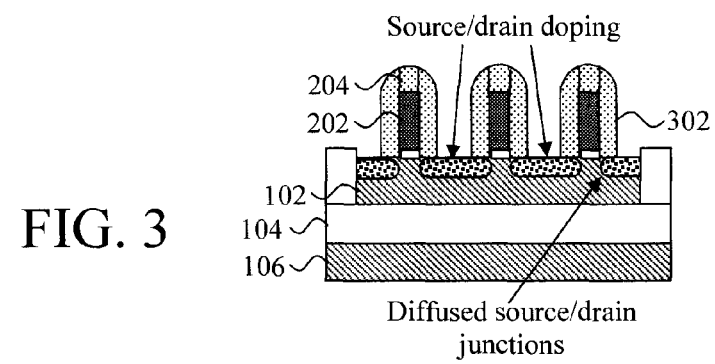
FIG. 3 is a cross-sectional diagram illustrating spacers having been formed on opposite sides of the dummy gates, and source and drain doping having been performed according to an embodiment of the present invention.

As shown in FIG. 3, source and drain region doping may be performed with the spacers in place. It is notable, however, that the source and drain region doping may alternatively be performed earlier in the process, such as prior to the formation of the spacers 302. In that case, the source and drain doping would be performed with no spacer or possibly a thin (e.g., 2 nm) first spacer in place. Any suitable standard dopants and implantation techniques may be employed to form the doped source and drain regions. By way of example only, suitable n-type dopants include but are not limited to phosphorous (P), and suitable p-type dopants include but are not limited to boron (B). As shown in FIG. 3, the source and drain region dopants may be implanted into the SOI layer 102 on opposite sides of the dummy gates 202 and diffused to the edges of the dummy gate during subsequent high temperature steps.

As is known in the art, raised source and drains (not shown) may be formed. Raised source and drains can be formed at different points in the process. By way of example only, standard processes can be used to form raised source and drains after the source and drain region doping, or after the replacement gate stacks have been formed (see below), etc.

Figure 4:
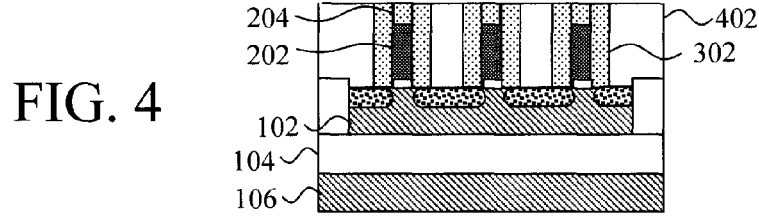
FIG. 4 is a cross-sectional diagram illustrating a gap fill dielectric having been deposited onto the wafer filling in any gaps between the spacers according to an embodiment of the present invention.

In order to permit removal (and subsequent replacement) of the dummy gates 202, a gap fill dielectric 402 is deposited onto the wafer filling in spaces between the dummy gates 202 (or more specifically filling in any gaps between the spacers 302 on opposite sides of adjacent dummy gates). See FIG. 4. Suitable gap fill dielectric materials include, but are not limited to, oxide materials such as silicon dioxide ($SiO_2$). As shown in FIG. 4, once the gap fill dielectric 402 has been deposited, it is preferably polished down to the surface of the dummy gate hardmasks 204. If an etching process such as chemical mechanical polishing (CMP) is used, then some of the dummy gate hardmask 204 and spacer 302 material can also be removed resulting in a flat, planar surface.

Figure 5:
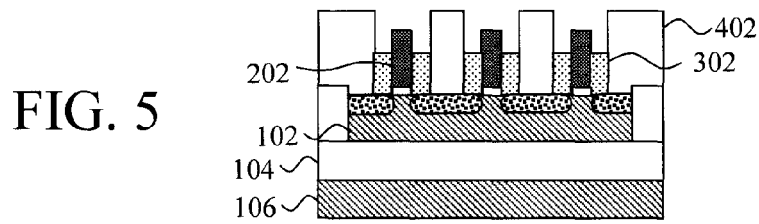
FIG. 5 is a cross-sectional diagram illustrating dummy gate hardmasks having been removed to expose the tops of the dummy gates according to an embodiment of the present invention.
Figure 6:
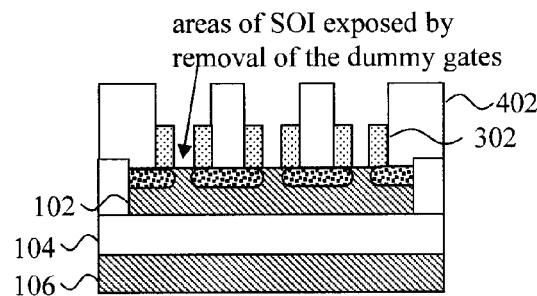
FIG. 6 is a cross-sectional diagram illustrating the dummy gates and the dummy gate oxide having been selectively removed from between the spacers according to an embodiment of the present invention.
Figure 7:
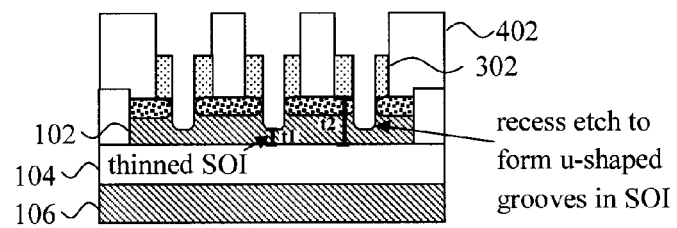
FIG. 7 is a cross-sectional diagram illustrating areas of the SOI layer exposed by removal of the dummy gates and the dummy gate oxide having been recessed to form u-shaped grooves that extend part way through the SOI layer such that the SOI layer remaining in the channel regions (over the BOX) is thinner than the SOI layer in source and drain regions according to an embodiment of the present invention.

In order to permit the dummy gates 202 to be selectively removed, the tops of the dummy gates 202 are now exposed by removing the dummy gate hardmasks 204. See FIG. 5. The dummy gate hardmasks 204 can be removed selective to the dummy gates 202 using a selective RIE process, such as a nitride-selective RIE for SiN hardmasks. Depending on the similarity between the dummy gate hardmask material 204 and the spacers 302, some etching of the spacers 302 is expected. However the etch time needed to completely remove the hardmasks 204 from the dummy gates 202 will result in only a partial removal of the spacers 302. This scenario is depicted in FIG. 5.

The dummy gates 202 and the dummy gate oxide can now be selectively removed from between the spacers 302. See FIG. 6. According to an exemplary embodiment, the dummy gates 202 are removed using a dummy gate selective wet chemical etching or dry etching process. As provided above, the dummy gate oxide acts as a stopping layer during this dummy gate removal etch. The dummy gate oxide can then be removed using an oxide selective etching process.

As provided above, in accordance with an exemplary embodiment, fully-depleted MOSFETs are formed having a u-shaped channel. The u-shaped channel is formed by recessing areas of the SOI layer that are exposed by the removal of the dummy gates and the dummy gate oxide to form one or more u-shaped grooves that extend part way through the SOI layer. See FIG. 7. Another way to visualize this step is that this recessing of the SOI layer 102 will leave only a thin SOI layer in the channel regions of the device over the BOX (e.g., this thinned area of the SOI layer (labeled "thinned SOI") will have a thickness of from about 3 nm to about 10 nm, and ranges therebetween). A timed etch (such as RIE) can be performed to recess the SOI layer 102. The etch can be endpointed when a portion of the SOI layer 102 is present over the BOX that has the desired thickness. Alternatively, the SOI layer can be recessed in this step via a controlled oxidation/oxide strip process, wherein the exposed SOI layer can be oxidized, followed by a stripping of the oxide. These oxidation/oxide strip steps can be repeated multiple times until the SOI layer in the channel regions is recessed to the desired thickness (see above).

It is apparent that the SOI layer 102 now has regions of differing thicknesses. Namely, according to an exemplary embodiment, in the channel regions the SOI layer 102 will have a (reduced) thickness of from about 3 nm to about 10 nm, and ranges therebetween. Elsewhere, e.g., in the source and drain regions under the spacers, the SOI layer 102 will be thicker, i.e., based on the starting thickness of the SOI layer of from about 8 nm to about 20 nm, and ranges therebetween—see above. Another way to look at it is that the SOI layer 102 will now have at least a first thickness t1 (in the channel regions) and at least a second thickness t2 (in the source and drain regions under the spacers), wherein the first thickness is less than the second thickness, i.e., t1<t2—see FIG. 7.

Replacement gate stacks 802 are then formed in the u-shaped grooves. See FIG. 8. According to an exemplary embodiment, the gate stacks 802 include a conformal gate dielectric, a conformal workfunction setting metal, and a (low resistance) filler metal. By way of example only, the gate stacks 802 are formed by first using a conformal deposition process to deposit a gate dielectric material into and lining the u-shaped grooves. Suitable conformal deposition processes include, but are not limited to, chemical vapor deposition (CVD) or atomic layer deposition (ALD). According to an exemplary embodiment, the gate dielectric is a high-κ material such as hafnium oxide ($HfO_2$) or lanthanum oxide ($La_2O_3$). The term "high-κ" as used herein refers to a material having a relative dielectric constant κ which is much higher than that of silicon dioxide (e.g., a dielectric constant κ=25 for $HfO_2$ rather than 4 for silicon dioxide). Next, a conformal workfunction setting metal layer is deposited (e.g., using CVD or ALD) into the u-shaped grooves on the gate dielectric. The particular workfunction metal employed can vary depending on whether an n-type or p-type transistor is desired. Suitable n-type workfunction metals include, but are not limited to, titanium nitride (TiN), tantalum nitride (TaN), and aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and tantalum aluminum carbide (TaAlC). Suitable p-type workfunction metals include, but are not limited to, TiN, TaN, and tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above. Finally a low resistance gate metal (i.e., a filler gate metal) is deposited into the u-shaped grooves, filling the u-shaped grooves. Suitable low resistance gate metals include, but are not limited to tungsten (W) or aluminum (Al).

Figure 8:
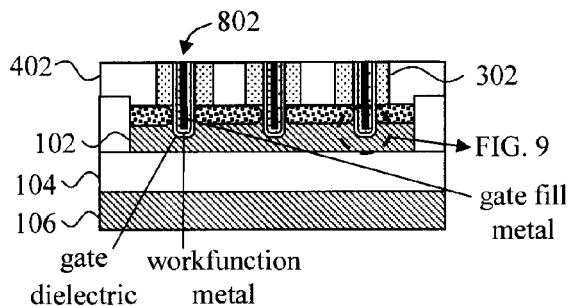
FIG. 8 is a cross-sectional diagram illustrating replacement gate stacks having been formed in the u-shaped grooves according to an embodiment of the present invention.

As shown in FIG. 8, in order to remove excess gate materials and to provide a flat planar surface for further processing, a planarizing process (such as CMP) can be used to polish the gap fill dielectric 402 and replacement gate materials down to the spacers 302.

Figure 9:
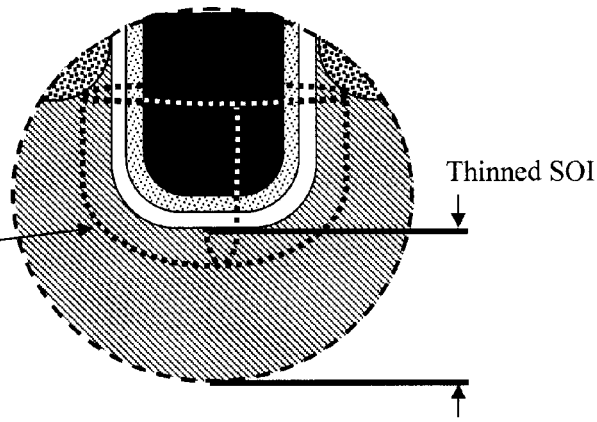
FIG. 9 is a cross-sectional diagram illustrating an enlarged view of a bottom of a gate stack from FIG. 8 and the underlying channel which shows that due to the u-shaped configuration of the gate stack, a u-shaped channel is formed in fully depleted regions of the SOI layer adjacent to the gate stacks according to an embodiment of the present invention.

FIG. 9 provides an enlarged view of a bottom of a gate stack from FIG. 8 and the underlying channel. As shown in FIG. 9, due to the u-shaped configuration of the gate stack, a u-shaped channel (which is u-shaped in three-dimensions) is formed in fully depleted regions of the SOI layer adjacent to, and which surrounds, each of the gate stacks.

Any further desired processing of the device may now be performed. By way of example only, FIGS. 10-12 depict an exemplary middle of the line (MOL) metallization process. For example, as shown in FIG. 10, an interlayer dielectric 1002 is deposited onto the wafer, covering the spacers 302, gap fill dielectric 402, and gate stacks 802. Suitable interlayer dielectrics include, but are not limited to, oxides such as $SiO_2$, hydrogen silsesquioxane (HSQ), etc. Standard lithography and etching techniques are then used to pattern vias in the interlayer dielectric 1002 and gap fill dielectric 402, down to the doped source and drain regions.

To reduce the contact resistance between metal interconnects (to-be-formed in the vias) and the doped source and drain regions, a silicide 1004 is preferably formed at the bottom of each of the vias. See FIG. 10. By way of example only, silicide 1004 can be formed by first depositing a silicide metal into the vias. Suitable silicide metals include, but are not limited to, nickel (Ni). The wafer is then annealed to react the silicide metal with the SOI layer 102 at the bottom of the vias. The silicide is self-aligned (i.e., a salicide) in the sense that the silicide will only form where the silicide metal is in contact with the semiconductor (i.e., the SOI at the bottom of the vias).

Metal interconnects 1102 are then formed in the vias. See FIG. 11. As shown in FIG. 11, the metal interconnects 1102 can be formed by first depositing a conformal barrier/wetting layer and then filling the via with a contact metal. Suitable barrier/wetting layer materials include, but are not limited to, metals such as titanium (Ti) and titanium nitride (TiN). Suitable contact metals include, but are not limited to, tungsten (W).

In the present example, an M1 metallization layer is next formed on the wafer. See FIG. 12. A standard damascene process can be employed to form the M1 metallization layer. For example, as shown in FIG. 12, a planarizing dielectric 1202 is formed on the wafer, metal line trenches are patterned in the planarizing dielectric 1202, and the metal line trenches are filled with a metal(s) to form M1 metal lines 1204. As shown in FIG. 12, an etch stop layer (e.g., a nitride layer) can be placed beneath the planarizing dielectric 1202. The etch stop layer will give an endpoint signal to the M1 trench etch, and in higher levels of metal it helps to seal the tops of the metal lines. Excess metal overfilling the metal line trenches can be removed using a polishing process such as CMP. In the example shown, the M1 metal lines 1204 are formed by first depositing a barrier/wetting layer lining the metal line trenches and then filling the metal line trenches with a contact metal. Suitable barrier/wetting layer metals include, but are not limited to, TiN. Suitable contact metals include, but are not limited to, copper (Cu).

Variations of the above-described process flow are anticipated herein. By way of example only, rather than forming individual doped source and drain regions as described above, the efficiency and effectiveness of the process might be optimized through the use of a doped layer, through which the u-shaped grooves are extended to form the fully-depleted channel. This exemplary alternative embodiment is now described by way of reference to FIGS. 13-20.

As with the above-described flow, the process begins with an SOI wafer. See, for example, FIG. 1 which illustrates an SOI wafer having an SOI layer 102 separated from a substrate 106 by a BOX 104. Suitable materials for the SOI layer 102, BOX 104, and substrate 106 were provided above. It is notable that the thickness of the starting SOI layer may be less than in the previous example. This is to account for the additional doped layer (i.e., doped layer 1302—see below) which in this example may be epitaxially grown on the SOI layer 102. As described in conjunction with the description of FIG. 1 above, standard STI isolation can be used to define an active area(s) in the SOI layer 102.

Thus following from FIG. 1, as shown in FIG. 13 the next step in this exemplary alternative embodiment involves forming a doped layer 1302 on the SOI layer 102 (i.e., on a side of the SOI layer 102 opposite the BOX 104). The doped layer 1302 will be used to form doped source and drain regions of the device. The combined thickness of SOI layer 102 and the doped layer 1302 is from about 8 nanometer (nm) to about 20 nm, and ranges therebetween. This combination of layers will be recessed later in the process so as to be thinner below the gate stacks. By way of example only, the doped layer 1302 can be formed from Si, Ge, or SiGe. According to an exemplary embodiment, the doped layer 1302 is epitaxially grown on the SOI layer 102, e.g., to a thickness of less than about 3 nm. Advantageously, an epitaxial process permits in-situ doping during growth thereby providing enhanced control over doping uniformity, concentration, etc. This enhanced control over the doping process is especially advantageous in scaled devices with a tight pitch which make traditional doping implantation techniques difficult. As provided above, suitable n-type dopants include but are not limited to phosphorous (P), and suitable p-type dopants include but are not limited to boron (B). Alternatively, doping of layer 1302 can be performed ex-situ using standard implantation techniques. The doped layer 1302 should be as thin as possible to reduce the overlap region with the subsequently formed replacement gate stacks, thereby reducing the gate to source or drain overlap capacitance. However, the doped layer 1302 should be as thick as needed to provide adequate conductance between the edge of the gate stacks and the raised source and drain contact regions (see above) that may be introduced outside of the spacers.

As with the above example, a replacement gate process will be employed. Thus, to begin the replacement gate process, a dummy gate oxide and one or more dummy gates 1402 are formed on the doped layer 1302 (i.e., on the doped layer 1302 over portions of the SOI layer that serve as channel regions of the MOSFET device) in the active area. See FIG. 14. The dummy gates 1402 are formed by first depositing/forming the dummy gate oxide on the doped layer 1302 in the active area. The dummy gate oxide will act as a stopping layer and protect the underlying doped layer 1302 during the dummy gate removal process described below. According to an exemplary embodiment, the dummy gate oxide is grown using thermal oxidation of the doped layer 1302 to a thickness of from about 2 nm to about 4 nm, and ranges therebetween. A thermal oxidation process will form a blanket layer of the dummy gate oxide on the doped layer 1302, which can be patterned along with the dummy gate poly-Si (see below).

Next, a layer of poly-Si is blanket deposited (e.g., using LPCVD) onto the dummy gate oxide (i.e., onto a side of the dummy gate oxide opposite the doped layer 1302). By way of example only, the poly-Si may be deposited to a thickness of from about 100 nm to about 150 nm, and ranges therebetween. A dummy gate hardmask 1404 (e.g., SiN) is then patterned on the poly-Si with the footprint and location of the dummy gates 1402. An etching process, such as a poly-Si-selective RIE process is then used to pattern the poly-Si layer into the dummy gates 1402. As provided above, the dummy gate oxide does not require patterning, but in practice the dummy gate oxide can be removed during the post dummy-gate-etch wet cleans (e.g., HF).

Spacers 1406 are next formed on opposite sides of the dummy gates 1402. By way of example only, the spacers 1406 can be formed by blanket depositing a suitable spacer material (such as SiN) onto the wafer and then using an anisotropic etching process, such as RIE, to define spacers 1406 in the material on opposite sides of the dummy gates. The spacers 1406 will serve to offset the source and drain contact regions from the gates.

As is known in the art, raised source and drains (not shown) may be formed. Raised source and drains can be formed at different points in the process. By way of example only, standard processes can be used to form raised source and drains after spacers 1406 have been formed, or after the replacement gate stacks have been formed (see below), etc.

Figure 15:
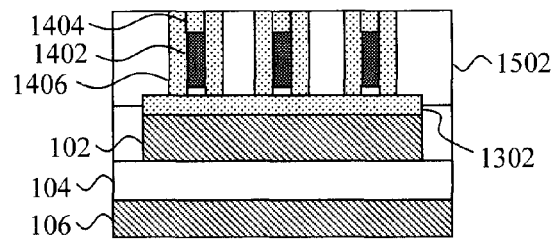
FIG. 15 is a cross-sectional diagram illustrating a gap fill dielectric having been deposited onto the wafer filling in any gaps between the spacers according to an embodiment of the present invention.

In order to permit removal (and subsequent replacement) of the dummy gates 1402, a gap fill dielectric 1502 is deposited onto the wafer filling in spaces between the dummy gates 1402 (or more specifically filling in any gaps between the spacers 1406 on opposite sides of adjacent dummy gates). See FIG. 15. Suitable gap fill dielectric materials include, but are not limited to, oxide materials such as $SiO_2$. As shown in FIG. 15, once the gap fill dielectric 1502 has been deposited, it is preferably polished down to the surface of the dummy gates 1402 (e.g., using CMP). As shown in FIG. 15, CMP can also serve to remove some of the dummy gate hardmask 1404 and spacer 1406 material in this step resulting in a flat, planar surface.

Figure 16:
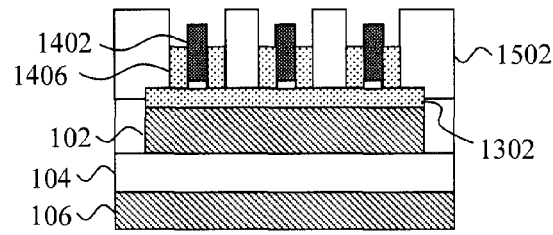
FIG. 16 is a cross-sectional diagram illustrating dummy gate hardmasks having been removed to expose the tops of the dummy gates according to an embodiment of the present invention.
Figure 17:
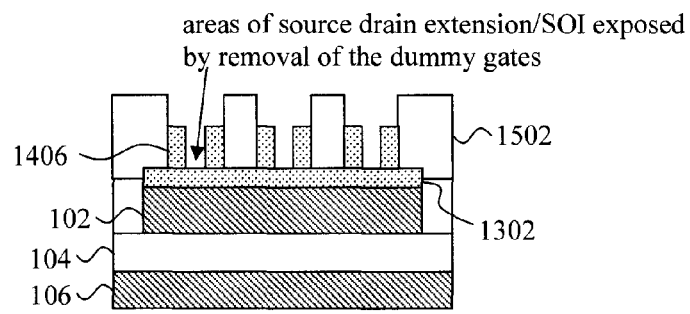
FIG. 17 is a cross-sectional diagram illustrating the dummy gates and the dummy gate oxide having been selectively removed from between the spacers according to an embodiment of the present invention.

In order to permit the dummy gates 1402 to be selectively removed, the tops of the dummy gates 1402 are now exposed by removing the dummy gate hardmasks 1404. See FIG. 16. The dummy gate hardmasks 1404 can be removed selective to the dummy gates 1402 using a selective RIE process, such as a nitride-selective RIE for SiN hardmasks. Depending on the similarity between the dummy gate hardmask material 1404 and the spacers 1406, some etching of the spacers 1406 is expected. However the etch time needed to completely remove the hardmasks 1404 from the dummy gates 1402 will result in only a partial removal of the spacers 1406. This scenario is depicted in FIG. 16.

The dummy gates 1402 can now be selectively removed from the gap fill dielectric 1502. See FIG. 17. According to an exemplary embodiment, the dummy gates 1402 are removed using a dummy gate selective wet chemical etching or dry etching process. As provided above, the dummy gate oxide acts as a stopping layer during this dummy gate removal etch. The dummy gate oxide can then be removed using an oxide selective etching process.

As provided above, in accordance with an exemplary embodiment, fully-depleted MOSFETs are formed having a u-shaped channel. The u-shaped channel is formed by recessing areas of the doped layer 1302 and underlying areas of the SOI layer that are exposed by the removal of the dummy gates and the dummy gate oxide to form one or more u-shaped grooves that extend part way through the SOI layer. See FIG. 18. Another way to visualize this step is that this recessing of the doped layer 1302 and underlying SOI layer 102 will leave only a thin SOI layer in the channel regions of the device over the BOX (e.g., this thinned area of the SOI layer (labeled "thinned SOI") will have a thickness of from about 3 nm to about 10 nm, and ranges therebetween). Depending on the compositions of the doped layer 1302 and SOI layer 102 either a single or multi-step etching process may be employed to recess the doped layer 1302 and the SOI layer 102. With regard to recessing the SOI layer 102, a timed etch (such as RIE) can be performed. This etch can be endpointed when a portion of the SOI layer 102 is present over the BOX having the desired thickness. Alternatively, as described above, the SOI layer can be recessed in this step via a controlled oxidation/oxide strip process, which can be repeated multiple times until the SOI layer in the channel region is recessed to the desired thickness (see above).

It is apparent that the device structure being formed on the SOI layer 102 now has regions of differing thicknesses. Namely, according to an exemplary embodiment, in the channel regions the SOI layer 102 will have a (reduced) thickness of from about 3 nm to about 10 nm, and ranges therebetween. In the source and drain regions under the spacers the SOI layer 102 combined with the doped layer 1302 will be thicker, i.e., from about 8 nm to about 20 nm, and ranges therebetween—see above. Another way to look at it is that the SOI layer 102 will now have at least a first thickness t1' (in the channel regions) and at least a second thickness t2' (in the source and drain regions under the spacers next to the channel regions), wherein the first thickness is less than the second thickness, i.e., t1'<t2'—see FIG. 18.

Figure 18:
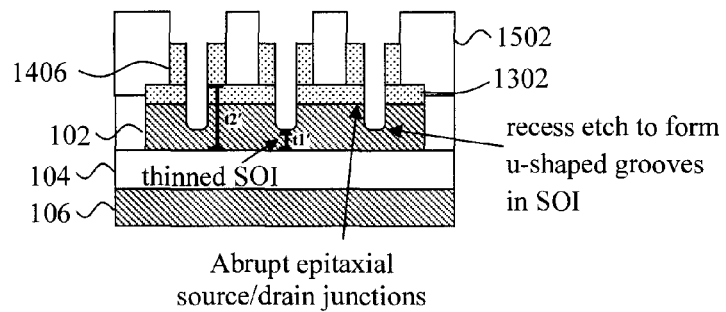
FIG. 18 is a cross-sectional diagram illustrating areas of the doped source and drain extension layer and areas of the underlying SOI layer exposed by removal of the dummy gates and the dummy gate oxide having been recessed to form u-shaped grooves that extend through the doped source and drain extension layer and part way through the SOI layer such that the SOI layer remaining in the channel regions is thinner than the SOI layer in the doped source and drain regions according to an embodiment of the present invention.

As shown in FIG. 18, following this recess etch, portions of the doped layer 1302 will only be present on opposite sides of the u-shaped grooves (in which the replacement gate stacks will be formed). These portions of the doped layer 1302 will form the doped source and drain regions on opposite sides of the replacement gate stacks. The source/drain junctions in this case may be abrupt, epitaxial junctions. See FIG. 18. By comparison, in the exemplary embodiment provided above where source/drain dopants are implanted in the SOI layer (see, for example, FIG. 3—described above), the source/drain junctions are diffused junctions.

Replacement gate stacks 1902 are then formed in the u-shaped grooves. See FIG. 19. According to an exemplary embodiment, the gate stacks 1902 include a conformal gate dielectric, a conformal workfunction setting metal, and a (low resistance) filler metal. By way of example only, the gate stacks 1902 are formed by first using a conformal deposition process (e.g., CVD or ALD) to deposit a gate dielectric material into and lining the u-shaped grooves. According to an exemplary embodiment, the gate dielectric is a high-κ material such as hafnium oxide or lanthanum oxide. Next, a conformal workfunction setting metal layer is deposited (e.g., using CVD or ALD) into the u-shaped grooves on the gate dielectric. As described above, the particular workfunction metal employed can vary depending on whether an n-type or p-type transistor is desired. Suitable n-type workfunction metals include, but are not limited to, titanium nitride (TiN), tantalum nitride (TaN), and aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and tantalum aluminum carbide (TaAlC). Suitable p-type workfunction metals include, but are not limited to, TiN, TaN, and tungsten (W). Finally a low resistance gate metal (i.e., a filler gate metal) is deposited into the u-shaped grooves, filling the u-shaped grooves. Suitable low resistance gate metals include, but are not limited to tungsten (W) or aluminum (Al).

Figure 19:
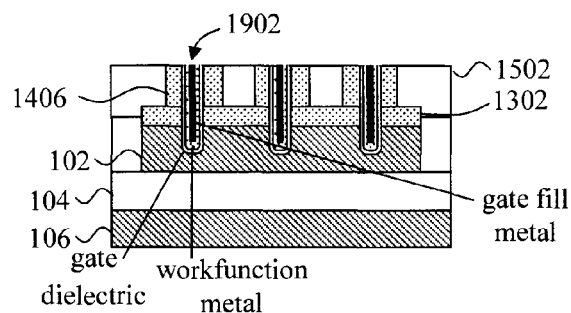
FIG. 19 is a cross-sectional diagram illustrating replacement gate stacks having been formed in the u-shaped grooves such that u-shaped channels are formed in fully depleted regions of the SOI layer adjacent to the u-shaped replacement gate stacks according to an embodiment of the present invention.

As shown in FIG. 19, in order to remove excess gate materials and to provide a flat planar surface for further processing, a planarizing process (such as CMP) can be used to polish the gap fill dielectric 1502 and replacement gate materials down to the spacers 1406. As described (e.g., in conjunction with the description of FIG. 9) above, due to the u-shaped configuration of the gate stack a u-shaped channel is formed in fully depleted regions of the SOI layer adjacent to, and which surrounds, each of the gate stacks.

Figure 20:
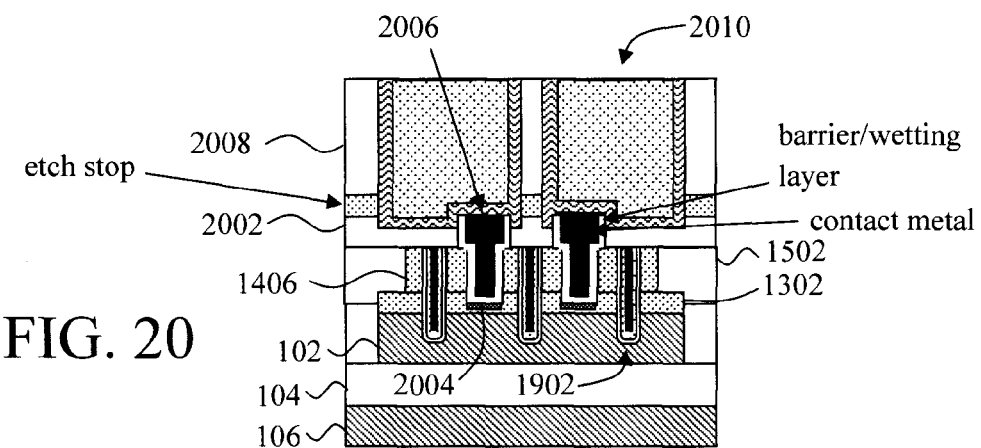
FIG. 20 is a cross-sectional diagram illustrating an exemplary middle of the line (MOL) metallization process having been used to form an M1 metallization layer and metal interconnects from the M1 metallization layer to the doped source and drain regions according to an embodiment of the present invention.

Any further desired processing of the device may now be performed. By way of example only, FIG. 20 depicts an exemplary middle of the line (MOL) metallization process. This exemplary MOL embodiment follows the same general process described above, and depicted in FIGS. 10-12. Thus, reference may be made to FIGS. 10-12 for depictions of the sequence of intermediate steps. As shown in FIG. 20, an interlayer dielectric 2002 is deposited onto the wafer, covering the spacers 1406, gap fill dielectric 1502, and gate stacks 1902. Suitable interlayer dielectrics include, but are not limited to, oxides such as $SiO_2$, HSQ, etc. Standard lithography and etching techniques are then used to pattern vias in the interlayer dielectric 2002 and gap fill dielectric 1502, down to the portions of the doped layer 1302 that form the doped source and drain regions on opposite sides of the replacement gate stacks.

To reduce the contact resistance between metal interconnects (to-be-formed in the vias) and the doped source and drain regions, a silicide 2004 is preferably formed at the bottom of each of the vias. See FIG. 20. By way of example only, silicide 2004 can be formed by first depositing a silicide metal (e.g., Ni) into the vias. The wafer is then annealed to react the silicide metal with the doped layer 1302 at the bottom of the vias. The silicide is self-aligned (i.e., a salicide) in the sense that the silicide will only form where the silicide metal is in contact with the semiconductor (i.e., the doped layer 1302 at the bottom of the vias). Namely, an anneal is then performed to react the silicide metal with the SOI at the bottom of the vias forming silicide 2004. Unreacted silicide metal can then be removed using, e.g., a wet etching process.

Metal interconnects 2006 are then formed in the vias. As shown in FIG. 20, the metal interconnects 2006 can be formed by first depositing a conformal barrier/wetting layer and then filling the via with a contact metal. Suitable barrier/wetting layer metals include, but are not limited to, Ti and TiN. Suitable contact metals include, but are not limited to, W.

In the present example, an M1 metallization layer is next formed on the wafer. A standard damascene process can be employed to form the M1 metallization layer. For example, as shown in FIG. 20, a planarizing dielectric 2008 is formed on the wafer, metal line trenches are patterned in the planarizing dielectric 2008, and the metal line trenches are filled with a metal(s) to form M1 metal lines 2010. As shown in FIG. 20, an etch stop layer (e.g., a nitride layer) can be placed beneath the planarizing dielectric 2008. The etch stop layer will give an endpoint signal to the M1 trench etch, and in higher levels of metal it helps to seal the tops of the metal lines. Excess metal overfilling the metal line trenches can be removed using a polishing process such as CMP. In the example shown, the M1 metal lines 2010 are formed by first depositing a barrier/wetting layer lining the metal line trenches and then filling the metal line trenches with a contact metal. Suitable barrier/wetting layer metals include, but are not limited to, TiN. Suitable contact metals include, but are not limited to, copper (Cu).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a metal-oxide semiconductor field-effect transistor (MOSFET) device, the method comprising the steps of:
providing a semiconductor-on-insulator (SOI) wafer comprising an SOI layer separated from a substrate by a buried oxide (BOX);
forming a dummy gate oxide and one or more dummy gates on portions of the SOI layer that serve as channel regions of the MOSFET device, wherein the dummy gate oxide separates the dummy gates from the SOI layer, and wherein the dummy gates are formed by blanket depositing a poly-silicon layer on the wafer, patterning dummy gate hardmasks on the poly-silicon layer with a footprint and location of the dummy gates, and etching the poly-silicon layer using the dummy gate hardmasks to form the dummy gates;

forming spacers on opposite sides of the dummy gates;

forming doped source and drain regions in the SOI layer on opposite sides of the dummy gates;

depositing a gap fill dielectric on the wafer, filling any gaps between the spacers;

removing the dummy gates and the dummy gate oxide;

recessing areas of the SOI layer exposed by removal of the dummy gates and the dummy gate oxide to form one or more u-shaped grooves that extend part way through the SOI layer such that a thickness of the SOI layer remaining in the channel regions is less than a thickness of the SOI layer in the doped source and drain regions under the spacers; and forming u-shaped replacement gate stacks in the u-shaped grooves such that u-shaped channels are formed in fully depleted regions of the SOI layer adjacent to the u-shaped replacement gate stacks.

2. The method of claim 1, wherein the thickness of the SOI layer remaining in the channel regions is from about 3 nanometers to about 10 nanometers, and ranges therebetween, and wherein the thickness of the SOI layer in the doped source and drain regions under the spacers is from about 8 nanometers to about 20 nanometers, and ranges therebetween.

3. The method of claim 1, wherein the SOI layer comprises silicon, germanium, or silicon germanium.

4. The method of claim 1, further comprising the step of:

removing the dummy gate hardmasks from the dummy gates, wherein the removing of the dummy gate hardmasks recesses the spacers.

5. The method of claim 1, wherein the step of forming the u-shaped replacement gate stacks comprises the steps of:

depositing a conformal gate dielectric material into and lining the u-shaped grooves;

depositing a conformal workfunction setting metal layer into the u-shaped grooves on the gate dielectric material; and depositing a filler gate metal into and filling the u-shaped grooves.

6. The method of claim 5, wherein the conformal gate dielectric includes a high-κ material.

7. The method of claim 5, wherein the workfunction setting metal layer comprises an n-type workfunction metal selected from the group consisting of: titanium nitride, tantalum nitride, and aluminum-containing alloys.

8. The method of claim 5, wherein the workfunction setting metal layer comprises a p-type workfunction metal selected from the group consisting of: titanium nitride, tantalum nitride, and tungsten.

9. A method of forming a MOSFET device, the method comprising the steps of:

providing an SOI wafer comprising an SOI layer separated from a substrate by a BOX;

forming a doped layer on a side of the SOI layer opposite the BOX;

forming a dummy gate oxide and one or more dummy gates on the doped layer over portions of the SOI layer that serve as channel regions of the MOSFET device, wherein the dummy gate oxide separates the dummy gates from the doped layer, and wherein the dummy gates are formed by blanket depositing a poly-silicon layer on the wafer, patterning dummy gate hardmasks on the poly-silicon layer with a footprint and location of the dummy gates, and etching the poly-silicon layer using the dummy gate hardmasks to form the dummy gates;

forming spacers on opposite sides of the dummy gates;

depositing a gap fill dielectric on the wafer, filling any gaps between the spacers;

removing the dummy gates and the dummy gate oxide;

recessing areas of the doped layer and underlying areas of the SOI layer exposed by removal of the dummy gates and the dummy gate oxide to form one or more u-shaped grooves that extend through the doped layer and part way through the SOI layer such that portions of the doped layer, which serve as doped source and drain regions, will be present on opposite sides of the u-shaped grooves and such that a thickness of the SOI layer remaining in the channel regions is less than a combined thickness of the doping layer and the SOI layer in the doped source and drain regions under the spacers; and forming u-shaped replacement gate stacks in the u-shaped grooves such that u-shaped channels are formed in fully depleted regions of the SOI layer adjacent to the u-shaped replacement gate stacks.

10. The method of claim 9, wherein the thickness of the SOI layer remaining in the channel regions is from about 3 nanometers to about 10 nanometers, and ranges therebetween, and wherein the combined thickness of the doping layer and the SOI layer in the doped source and drain regions under the spacers is from about 8 nanometers to about 20 nanometers, and ranges therebetween.

11. The method of claim 9, wherein the doped layer is formed on the SOI layer using an epitaxial growth process.

12. The method of claim 11, wherein the doped layer comprises in situ-doped epitaxial silicon, germanium, or silicon germanium.

13. The method of claim 9, further comprising the step of:

removing the dummy gate hardmasks from the dummy gates, wherein the removing of the dummy gate hardmasks recesses the spacers.

* * * * *